US010394264B1

(12) United States Patent
Coimbra et al.

(10) Patent No.: US 10,394,264 B1
(45) Date of Patent: Aug. 27, 2019

(54) BACK BIAS REGULATOR CIRCUIT AND METHOD THEREFOR

(71) Applicant: NXP USA, INC., Austin, TX (US)

(72) Inventors: Ricardo Pureza Coimbra, Campinas (BR); Javier Mauricio Olarte Gonzalez, Campinas (BR); Ivan Carlos Ribeiro do Nascimento, Campinas (BR); Felipe Ricardo Clayton, Campinas (BR); Stefano Pietri, Austin, TX (US); Charles Eric Seaberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 4 days.

(21) Appl. No.: 15/892,463

(22) Filed: Feb. 9, 2018

(51) Int. Cl.
*G05F 1/59* (2006.01)
*H03K 17/687* (2006.01)

(52) U.S. Cl.
CPC .......... *G05F 1/59* (2013.01); *H03K 17/6872* (2013.01); *H03K 2217/0018* (2013.01)

(58) Field of Classification Search
CPC ..... G05F 1/00; G05F 1/59; G05F 3/00; G05F 3/205; G11C 5/00; G11C 5/145; H02M 2003/00; H02M 2003/077; H02M 3/00; H02M 3/07; H02M 3/073; H03K 17/00; H03K 17/6872; H03K 2217/00; H03K 2217/0018
USPC .......................................................... 327/536
See application file for complete search history.

(56) References Cited

U.S. PATENT DOCUMENTS

| | | | | |
|---|---|---|---|---|
| 5,874,851 | A | 2/1999 | Shiota et al. | |
| 9,088,280 | B2 | 7/2015 | Jarrar et al. | |
| 2005/0280463 | A1* | 12/2005 | Chih | G05F 3/205 327/538 |
| 2015/0116030 | A1* | 4/2015 | Jarrar | H03K 17/162 327/536 |
| 2017/0371364 | A1* | 12/2017 | Vareljian | G05F 1/575 |
| 2018/0191346 | A1* | 7/2018 | Jensen | H03F 3/181 |

OTHER PUBLICATIONS

Jacquet, David, et al.; "A 3 GHz Dual Core Processor ARM Cortex™-A9 in 28 um UTBB FD-SOI CMOS With Ultra-Wide Voltage Range and Energy Efficiency Optimization;" DOI: 10.1109/JSSC.2013.2295977; IEEE Journal of Solid-State Circuits ( vol. 49, Issue: 4. Apr. 2014 ).

* cited by examiner

*Primary Examiner* — Lincoln D Donovan
*Assistant Examiner* — Dave Mattison

(57) ABSTRACT

A back bias voltage generator circuit includes a first resistive element connected in series with a second resistive element; a first amplifier having a first input coupled to an input voltage, a second input coupled to a first node at a first terminal of the first resistive element, and an output coupled to an N-polarity metal-oxide semiconductor (NMOS) bias voltage node. A second amplifier has a first input coupled to a symmetrical voltage, a second input coupled to a second node between a second terminal of the first resistive element and a first terminal of the second resistive element, and an output coupled to a P-polarity metal-oxide semiconductor (PMOS) bias voltage node and the second terminal of the second resistive element. The symmetrical voltage is between a highest supply voltage and a lowest supply voltage coupled to the first amplifier.

20 Claims, 4 Drawing Sheets

80

BACK BIAS REGULATOR CIRCUIT AND METHOD THEREFOR

BACKGROUND

Field

This disclosure relates generally to integrated circuits, and more specifically, to a back bias regulator circuit and method therefore.

Related Art

In a circuit having a Sea-of-Gates (SoG), typically including both N-type (N-polarity) and P-type (P-polarity) Metal-oxide-semiconductor transistors (NMOS and PMOS transistors), threshold voltages can be adjusted to balance system performance and power usage. For example, a higher threshold voltage (Vt) can achieve lower leakage current and thus reduced power consumption but sacrifices performance (i.e. speed). On the other hand, a lower Vt achieves greater performance with respect to speed but at the cost of increased power consumption. Therefore, depending on the performance and power consumption needs of a system, it is desirable to adjust the Vts of the transistors in a SoG.

One way to adjust Vts is by dynamically controlling the back bias levels (e.g. body bias levels) of the PMOS and NMOS transistors. For example, forward back-biasing (FBB), in which Vts are decreased, is applied to enhance performance, and reverse back-biasing (RBB), in which Vts are increased, is applied to reduce power consumption at the cost of performance. However, if the transitions of the back bias levels are not well controlled, timing violations may result (resulting in logic malfunction). Also, it is desirable to support such back bias changes without stopping logic activity of the SoG in order to reduce time overhead and thus reduce performance and power losses. Therefore, a need exists for a back bias regulator circuit with controlled back bias level transitions to allow for adjusting Vts as needed to achieve system needs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a body bias regulator circuit regulates voltages on the body of PMOS and NMOS transistors in an SoG in a way which allows these back bias voltages to change in a timely, well-controlled and correlated, manner without stopping logic or interrupting the clock. In one embodiment, an input voltage is provided which sets the N well potential (Vnw) at an Nwell node for MOS transistors. Therefore, Vnw varies as the input voltage varies. Furthermore, a P well potential (Vpw) at a Pwell node for MOS transistors symmetrically tracks Vnw about a common node voltage (Vsym). In this manner, in response to the input voltage, Vnw and Vpw, and thus the back biasing, transition in a well controlled and correlated manner.

Figure 1:
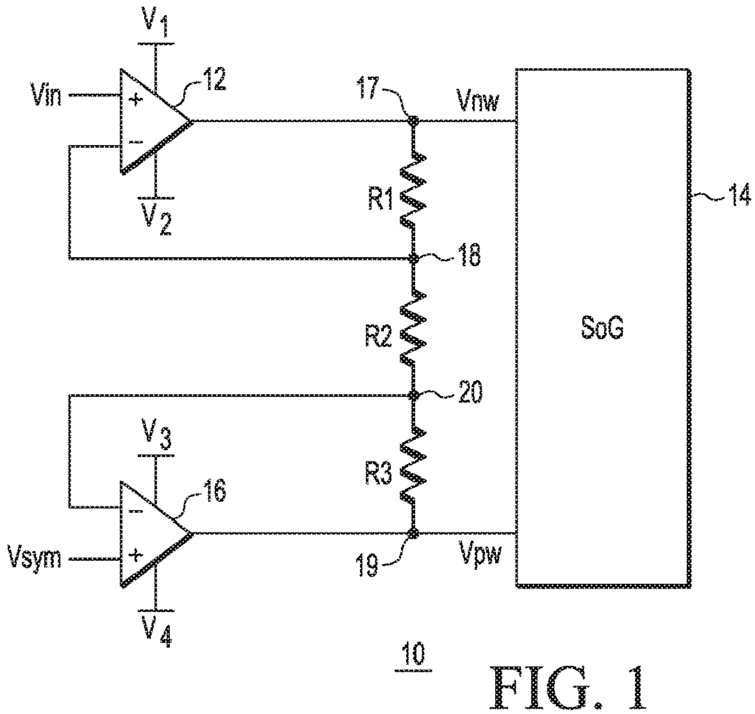
FIG. 1 illustrates, in partial schematic form and partial block diagram form, a body bias regulator circuit coupled to an SoG in accordance with one embodiment of the present invention.

FIG. 1 illustrates, in partial schematic and partial block diagram form, a back bias regulator circuit 10 coupled to an SoG 14 in accordance with one embodiment of the present invention. Circuit 10 includes amplifiers 12 and 16, and resistors R1, R2, and R3. A non-inverting input of amplifier 12 is coupled to receive an input voltage (Vin). An output of amplifier 12 is coupled to provide Vnw at an Nwell node 17 which is coupled to the N wells of transistors in SoG 14. Note that Nwell node 17 may also be referred to as an NMOS bias voltage node or a PMOS bias voltage node or an Nwell grid voltage node. A first terminal of R1 is coupled to node 17, and a second terminal of R1 is coupled to a circuit node 18. Circuit node 18 is coupled to an inverting input of amplifier 12. A first terminal of R2 is coupled to node 18 and a second terminal of R2 is coupled to a circuit node 20. Node 20 is coupled to an inverting input of amplifier 16. An output of amplifier 16 is coupled to provide Vpw at a Pwell node 19 which is coupled to the P wells of transistors in SoG 14. Note that Pwell node 19 may also be referred to as a PMOS bias voltage node or an NMOS bias voltage node or a Pwell grid voltage node. A first terminal of R3 is coupled to node 20 and a second terminal of R3 is coupled to node 19. A non-inverting input of amplifier 16 is coupled to receive a symmetrical voltage (Vsym) which may also be referred to as a common mode voltage for the N and P wells of SoG 14. Note that R2 and R3 form a resistor divider. Amplifier 12 is coupled between voltage supply nodes V1 and V2, and amplifier 16 is coupled between voltage supply nodes V3 and V4.

Note that various different technologies may be used for SoG 14, including but not limited to twin-well bulk technology, standard Fully Depleted Semiconductor-on-Insulator (FDSOI) technology, flipped-well FDSOI technology, partially depleted SOI technology. That is, back bias regulator circuit 10 can be applied to a SoG manufactured with any of these technologies.

In operation, circuit 10 operates to set Vnw and Vpw to bias Pwells and Nwells within SoG 14. In one embodiment, SoG 14 includes Nwell and Pwell grids for MOS transistors of SoG 14, in which node 17 is coupled to the Nwell grid and node 19 to the Pwell grid. Vin is an analog input voltage that represents the desired back bias level, in which Vin is translated into Vnw (a positive voltage) and Vpw (a negative voltage). Vsym is an analog input voltage that represents the voltage level in reference to which PMOS and NMOS body bias potentials will be maintained symmetrical. For example, for twin-well bulk technology, Vsym is Vdd/2 and for SOI flipped-well technology, Vsym is ground. In this embodiment, Vin translates into Vnw which controls Vpw about Vsym.

Amplifier 12 operates such that Vin appears at node 18 and amplifier 16 operates such that Vsym appears at node 20. Therefore, (Vsym−Vpw)/R3=(Vnw−Vsym)/(R1+R2). With Vpw regulated such that the voltage differences (Vsym−Vpw) and (Vsym−Vnw) are maintained proportional as expressed by (Vsym−Vpw)=(R3/(R1+R2))·(Vnw−Vsym), as derived from the previous equation. Vsym can be set at an appropriate point between the nominal (or zero) PMOS and NMOS body bias level. For example, for twin-well bulk technology and standard SOI, the PMOS and NMOS "zero" back bias condition occurs by connecting the body terminals to Vdd and ground, respectively. The NMOS back bias voltage (Vbbn), defined as a deviation of the body voltage from ground, is given by Vbbn=GND−Vpw, and the PMOS back bias voltage (Vbbp), defined a deviation of the body voltage from Vdd, is given by Vbbp=Vnw−Vdd.

By setting Vsym=(R3/(R1+R2+R3))·Vdd, then Vbbp=(R3/(R1+R2))·Vbbn. If R3=R1+R2, then Vsym=Vdd/2 and the back bias magnitudes for both PMOS and NMOS transistors are the same. This will be seen in more detail in reference to the example of FIG. 3 below. The feedback loop around amplifier 16 therefore maintains Vpw symmetrically matched to Vnw. The feedback loop around amplifier 12 sets the back-bias level as a function of Vin, which can be expressed as (Vnw−Vsym)=(1+(R1/R2))·(Vin−Vsym).

Referring to circuit 10 of FIG. 1, voltage supply node V1 should be set to the highest desired voltage output by amplifier 12, and voltage supply node V4 should be set to the lowest desired voltage output by amplifier 16. Voltage supply nodes V2 and V3 can be set to which voltage is needed for proper circuit operation, in which V1>V2 and V3>V4. Note that if V1 is needed to be higher than the available supply rail, e.g. Vdd, a positive charge pump or equivalent (e.g. DC-DC converter, linear regulator, etc.) is necessary, and if V4 is needed to be lower than the available supply rail, e.g. ground, a negative charge pump or equivalent (e.g. DC-DC converter, linear regulator, etc.) is necessary. Note that there are disadvantages to using charge pumps, which will be discussed further in reference to FIG. 2 below. Also, note that since Vnw controls Vpw about Vsym, the output of amplifier 12 is slew rate controlled such that Vpw is also slew rate controlled. By controlling (i.e. limiting) slew rate of the output of amplifier 12, it is not necessary to include matching slew rate control in amplifier 16, due to the fact that Vpw tracks Vnw. Any known circuitries and methods can be used to control or limit the slew rate of amplifier 12. Furthermore, slew rate limiting circuitry to limit the slew rate of amplifier 12 can be located within amplifier 12 or coupled to amplifier 12.

Figure 3:
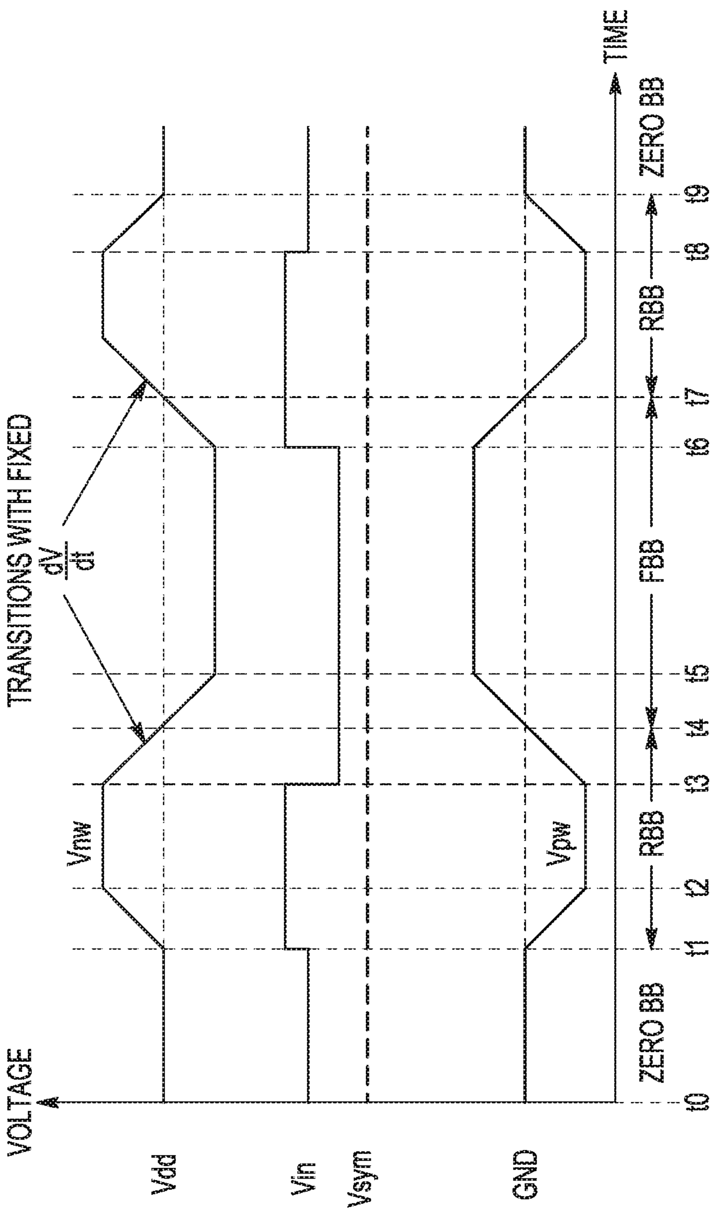
FIG. 3 illustrates, in timing diagram form, example waveforms of a plurality of signals of the circuit embodiments of FIGS. 1 and 2.

Referring to FIG. 3, waveforms for Vin, Vnw, and Vpw are depicted in accordance to one example of FIG. 1 in which R3=R1+R2 and SoG 14 corresponds to twin-well bulk technology or standard SOI (in which Vsym=Vdd/2). At time t0, Vin begins at a level that results in zero back biasing (Zero BB), therefore Vnw=Vdd and Vpw=ground. During Zero BB, SoG 14 experiences no acceleration. At time t1, Vin is increased to cause a transition into RBB. In response to an increase in Vin, Vnw transitions to a higher voltage by a particular amount above Vsym, and Vpw tracks Vnw to transition to a lower voltage by the same particular amount below Vsym. Therefore, the magnitude of the transitions of Vnw and Vpw have the same absolute value with respect to Vsym, but occur in opposite directions. At time t2, steady state is reached in which Vnw and Vpw are done transitioning and are at their respective higher and lower values, and SoG 14 is operating in a low power mode due to the shift to higher Vts.

At time t3, a transition to FBB for a higher power mode is initiated. Vnw transitions to a voltage lower than Vdd and Vpw, symmetrically tracking Vnw, transitions the same amount to a voltage higher than ground. During FBB, SoG 14 operates at an increased speed due to the lower Vts. At time t4, SoG 14 transitions from RBB to FBB, and at time t5, steady state in FBB is achieved. Note that Vnw, due to slew rate control of the output of amplifier 12, transitions in accordance with a fixed slope (fixed dV/dt). The slopes of the transitions may vary from the illustrated slope in different examples based on the slew rate limitations employed by circuit 10.

At time t6, transition begins again to RBB, from FBB. At time t7, FBB transitions to RBB, and at time t8, transition begins to Zero BB. At time t9, SoG 14 is again in Zero BB. In this manner, the back biasing of SoG 14 can change dynamically as needed based on the power modes. Furthermore, FIG. 3 only illustrates 3 back-biasing levels (power modes), one correlated to Zero BB, one to RBB, and one to FBB. However, in alternate embodiments, more level options may be implemented.

Figure 2:
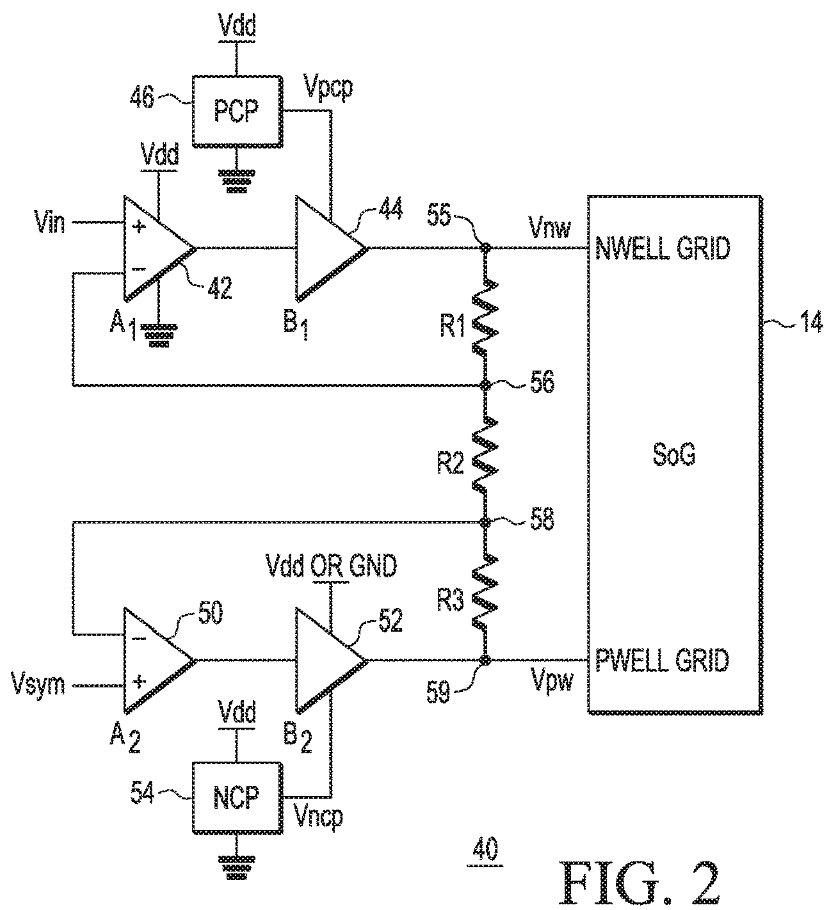
FIG. 2 illustrates, in partial schematic form and partial block diagram form, a body bias regulator circuit coupled to an SoG in accordance with one embodiment of the present invention.

FIG. 2 illustrates an implementation of circuit 10 of FIG. 1. As stated above, charge pumps may be necessary to power amplifiers 12 and 16 of FIG. 1. Also, due to the large capacitive coupling between the Nwells and Pwells of the SoG 14, it is difficult to obtain circuit stability. Illustrated in FIG. 2 is a back bias regulator circuit 40 which can be used to implement circuit 10. The implementation of FIG. 2 uses a multi-stage arrangement to minimize charge-pump current requirements and therefore reduce charge pump area and associated power losses. The multi-stage arrangement also provides frequency compensation which addresses the large capacitive coupling that exists between the wells. Therefore, improved circuit stability can be achieved.

In FIG. 2, circuit 40 includes amplifiers 42, 44, 50, and 52, resistors R1, R2, and R3, and charge pumps 46 and 54. Amplifier 42 is coupled to receive Vin at a non-inverting input. Amplifier 44 has an input coupled to the output of amplifier 42 and an output coupled to provide Vnw at an Nwell node 55 which is coupled to the N wells of transistors in SoG 14. Note that Nwell node 55 may also be referred to as an NMOS bias or Nwell grid voltage node. A first terminal of R1 is coupled to node 55, and a second terminal of R1 is coupled to a circuit node 56. Circuit node 56 is coupled to an inverting input of amplifier 42. A first terminal of R2 is coupled to node 56 and a second terminal of R2 is coupled to a circuit node 58. Node 58 is coupled to an inverting input of amplifier 50. An output of amplifier 50 is coupled to an input of amplifier 52, and an output of amplifier 52 is coupled to provide Vpw at a Pwell node 59 which is coupled to the P wells of transistors in SoG 14. Note that Pwell node 59 may also be referred to as a PMOS bias or Pwell grid voltage node. A first terminal of R3 is coupled to node 58 and a second terminal of R3 is coupled to node 59. A non-inverting input of amplifier 50 is coupled to receive Vsym. Amplifier 42 is coupled to voltage supply nodes Vdd and ground, amplifier 44 is coupled to an output of positive charge pump 46 to receive Vpcp, amplifier 52 is coupled to voltage supply node Vdd or Gnd and to an output of negative charge pump 54 to receive Vncp.

Operation of circuit 40 corresponds to operation of circuit 10 in which amplifier 12 is implemented with amplifiers 42 and 44, and amplifier 16 is implemented with amplifiers 50 and 52. Therefore, the operation details described above in reference to FIG. 1 also applies to FIG. 2 in which nodes 55, 56, 58, and 59 are analogous to nodes 17, 18, 20, and 19, respectively. In FIG. 2, amplifier 12 is implemented with two stages. Amplifier 42 is an amplification stage and amplifier 44 is an output or buffer stage. Amplifier 16 is also implemented with two stages. Amplifier 50 is an amplification stage and amplifier 52 is an output or buffer stage.

As described above in reference to FIG. 1, the feedback loop around amplifiers 50 and 52 maintains Vpw symmetrically matched to Vnw. The feedback loop around amplifiers 42 and 44 sets the back-bias level as a function of Vin. In this case, (Vnw−Vsym)=(1+(R1/R2)) (Vin−Vsym). Again, as above, setting Vsym to (R3/(R1+R2+R3))·Vdd, the previous equation becomes (Vnw−(Vdd/K))=(1+(R1/R2))·(Vin−(Vdd/K)), in which K=(R1+R2+R3)/R3. Note that R1 and R2 may be selected to set an appropriate Vin input range (within nominal ranges) for a given output range of back bias voltage while R3 may be selected accordingly to set the desired K value. So long as Vin stays within normal supply ranges for a given output range of back bias voltages, only amplifier 44 (and not amplifier 42) needs to be coupled to positive charge pump 46 to receive Vpcp, thereby minimizing current sunk from charge pump 46. Similarly, since Vsym is normally set within the normal supply rails, only amplifier 52 (and not amplifier 50) needs to be coupled to negative charge pump 54 to receive Vncp, thereby also minimizing current sunk by charge pump 54. Note that if the available supply voltages are high enough, positive charge pump 46 is not needed.

Amplifier 42 has a large direct-current (DC) gain with a well-defined and well-behaved slew rate limitation, and is supplied by the common Vdd and Gnd rails. Since amplifier 42 is the slowest of the amplifiers, it operates the slowest and can be implemented with larger devices than the other amplifiers. The slew-rate limitation of amplifier 42 determines the maximum dV/dt rate of Vnw, a described in reference to FIG. 3. As a consequence, amplifier 42 sets up the requirements (such as speed requirements) for the loop formed by amplifiers 50 and 52. Also, since Vnw controls Vpw, Vpw ends up with a well controlled slew rate. Any known circuitries and methods can be used to control the slew rate of amplifier 42. Furthermore, slew rate limiting circuitry to limit the slew rate of amplifier 42 can be located within amplifier 42 or coupled to amplifier 42. The output of amplifier 44 can also be designed to have a stable impedance. In this manner, circuit stability can be maintained even though there is a strong capacitive coupling between Vnw and Vpw.

Figure 4:
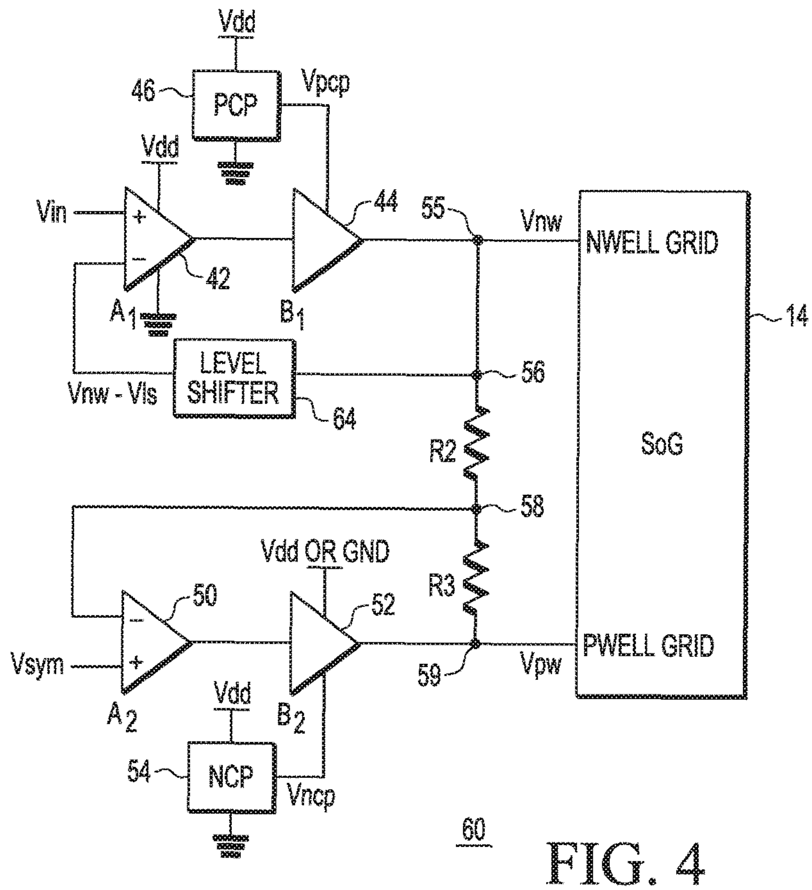
FIG. 4 illustrates, in partial schematic form and partial block diagram form, a body bias regulator circuit coupled to an SoG in accordance with one embodiment of the present invention.

FIG. 4 illustrates a back bias regulator circuit 60 similar to circuit 40 of FIG. 3, but without R1 and having a level shifter 64. In this embodiment, R1 is shorted such that nodes 55 and 56 are at the same potential. Rather than a current through R1 providing a voltage drop, level shifter 64 provides a constant level shift (Vls) of Vnw. Therefore, Vnw-Vls is provided to the inverting input of amplifier 42. The remaining operation of FIG. 4 is the same as was described above in reference to FIGS. 2 and 3. Note also that in the embodiments of FIGS. 2 and 3, R1 in each implementation can be zeroed out as well. Although not all advantages of the circuits may be achieved, Vpw would still symmetrically track Vnw about Vsym.

Figure 5:
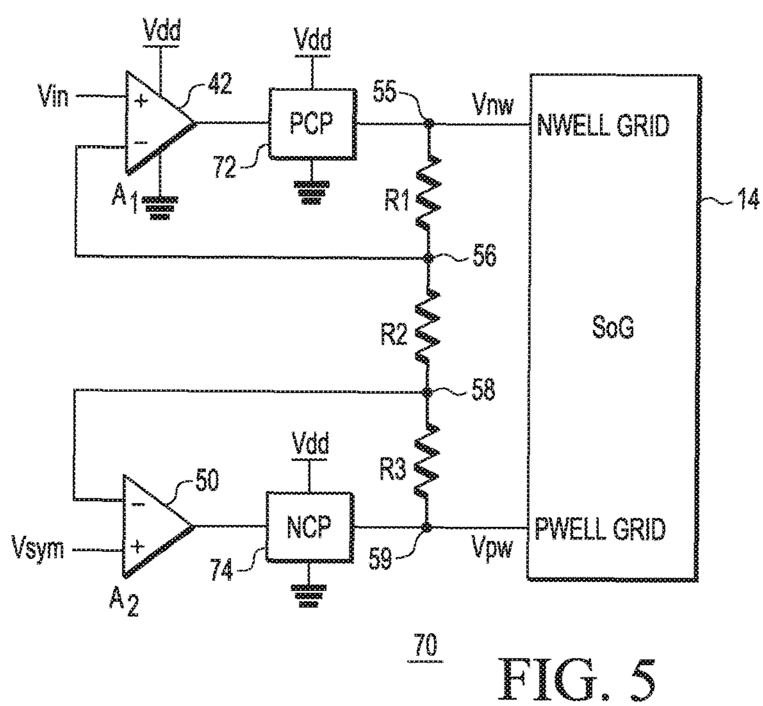
FIG. 5 illustrates, in partial schematic form and partial block diagram form, a body bias regulator circuit coupled to an SoG in accordance with one embodiment of the present invention.

FIG. 5 illustrates a back bias regulator circuit 70 similar to circuit 40 of FIG. 3, but with a positive charge pump 72 coupled between the output of amplifier 42 and node 55, rather than amplifier 44, and a negative charge pump 74 coupled between the output of amplifier 50 and node 59 rather than amplifier 52. In this embodiment, the output buffer stages are replaced with power supplies provided by the charge pumps. Also, amplifiers 42 and 50 operate as comparators and the charge pumps as DC-DC converters. While this provides an advantage of reduced power, Vnw and Vpw are less well controlled.

The back bias regulators described above can each be used as part of various back-biasing systems of various levels of complexity. In an open-loop approach, pre-defined values of supply voltage and back-biasing levels may be programmed to set different operation conditions (e.g. using a digital-to-analog converter (DAC) to generate programmable voltage levels). In a closed-loop approach, the performance-power trade-off may be monitored for real-time adjustments of supply voltages and back biasing levels.

Figure 6:
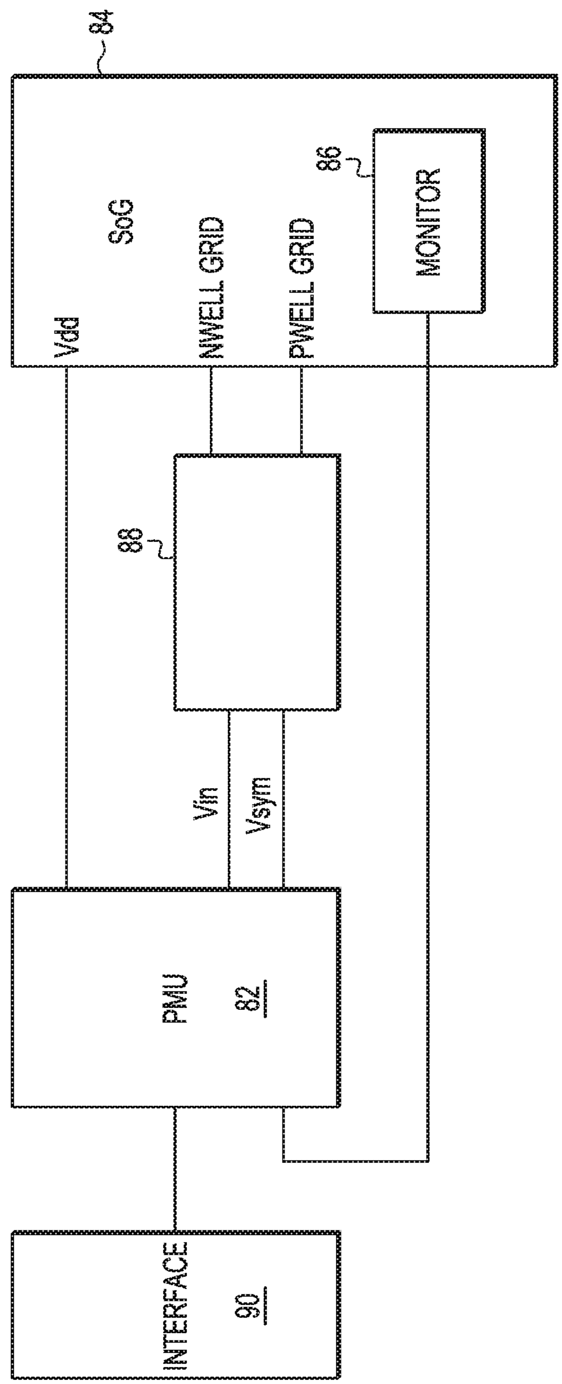
FIG. 6 illustrates, block diagram form, a system including a body bias regulator circuit in accordance with one embodiment of the present invention.

FIG. 6 illustrates a system 80 including a body bias regulator circuit 88 in accordance with one embodiment of the present invention, in which body bias regulator circuit 88 may be implemented as circuit 10, 40, 60, or 70. System 80 includes an interface 90 coupled to a power management unit (PMU) 82. PMU 82 is coupled to an SoG 84 and to circuit 88. PMU is coupled to provide Vdd to SoG 84 and coupled to receive information (e.g. feedback) from a monitor 86 that is a part of SoG 84. PMU 82 also provides Vin and Vsym to circuit 88, which provides Vnw to the Nwell grid of SoG 84 and Vpw to the Pwell grid of SoG 84.

System 80 is capable of adjusting an SoG performance-consumption trade-off in real time. Monitor 86 inside SoG 84 represents a circuit that senses variables related to SoG performance or power consumption or both. For example, monitor 86 may include a ring oscillator or delay line subject to the same voltages as the transistors of SoG 84. In this manner, system 80 provides a closed loop that can monitor operating frequency and continuously adjust back biasing in real time. For example, PMU 82 can process one or more feedback signals from monitor 86 to continuously adjust Vdd of SoG 84 and Vin of circuit 88. Circuit 88 then translates Vin generate by PMU 82 into the actual PMOS and NMOS back bias voltages (e.g. Vpw and Vnw), allowing fast back bias voltage transitions while maintaining back-bias voltages always symmetrical about Vsym to avoid timing violations.

Therefore, by now it can be understood how a body bias regulator circuit can regulate voltages on the body of PMOS and NMOS transistors in an SoG in a way which allows these back voltages to change in a timely, well-controlled and correlated, manner without stopping logic operation or interrupting the clock. An input voltage, representative of the desired back biasing levels, can be provided to the regulator circuit which can be translated into an N well potential (Vnw) and a P well potential (Vpw). Vnw controls Vpw such that Vpw symmetrically tracks Vnw about a common node voltage, Vsym. The circuit can also be defined such that Vnw transitions with a well-defined slew limitation, which ensures that Vpw matches the well-defined slew limitation. In this manner, in response to the input voltage, Vnw and Vpw, and thus the back biasing, transition in a well-controlled and correlated manner. Furthermore, by implementing multistage amplifier arrangements, charge pump current requirements can be reduced and circuit stability improved.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, R1, R2, and R3 used in various embodiments above can each be implemented using various types of resistive elements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a bias regulator circuit includes a voltage divider including a first resistive element and a second resistive element; a first node of the voltage divider coupled to a first terminal of the first resistive element; a second node of the voltage divider coupled between a second terminal of the first resistive element and a first terminal of the second resistive element; a first amplifier with a first input coupled to an input voltage, and a second input coupled to the first node; a first power supply coupled to the first amplifier; a second power supply coupled to the first amplifier; an N-polarity metal-oxide semiconductor (NMOS) bias voltage node coupled to an output of the first amplifier, a plurality of NMOS devices, and the first node; a second amplifier with a first input coupled to a symmetry voltage, and a second input coupled to the second node; a third power supply coupled to the second amplifier; a fourth power supply coupled to the second amplifier; a P-polarity metal-oxide semiconductor (PMOS) bias voltage node coupled to the output of the second amplifier, the second terminal of the second resistive element, and a plurality of PMOS devices. In one aspect, the voltage divider further includes a third resistive element having a first terminal coupled to the NMOS bias voltage node and a second terminal coupled to the first node. In a further aspect, the circuit further includes a third amplifier including an input coupled to the output of the first amplifier and an output coupled to the NMOS bias voltage node and the first terminal of the third resistive element. In yet a further aspect, the circuit further includes a fourth amplifier including an input coupled to the output of the second amplifier and an output coupled to the PMOS bias voltage node, and the second terminal of the second resistive element. In yet an even further aspect, the circuit further includes a first charge pump configured to supply voltage to the third amplifier; and a second charge pump configured to supply voltage to the fourth amplifier. In another aspect of this embodiment, the circuit further includes a first charge pump coupled between the output of the first amplifier and the NMOS bias voltage node; a second charge pump coupled between the output of the second amplifier and the PMOS bias voltage node. In another aspect, the circuit further includes slew rate limiting circuitry coupled to the first amplifier. In yet another aspect, a level shifter circuit having a first terminal coupled to the first node and a second terminal coupled to the second input of the first amplifier.

In another embodiment, a method for making a semiconductor device capable of generating symmetrical back bias voltages includes providing a first resistive element and a second resistive element in series, wherein a first node is at a first terminal of the first resistive element and a second node is between a second terminal of the first resistive element and a first terminal of the second resistive element; providing a first differential amplifier with a first input couplable to an input voltage, a second input coupled to the first node, and the output coupled to an N-polarity metal-oxide semiconductor (NMOS) bias voltage node; providing a second differential amplifier with a first input couplable to a symmetrical voltage, a second input coupled to the second node, and the output coupled to a P-polarity metal-oxide semiconductor (PMOS) bias voltage node and the second terminal of the second resistive element, wherein the symmetrical voltage is between a highest voltage and a lowest voltage coupled to operate the first differential amplifier. In one aspect, the method further includes coupling the NMOS bias voltage node to a plurality of NMOS semiconductor transistor devices; coupling the PMOS bias voltage node to a plurality of PMOS semiconductor transistor devices. In another aspect, the method further includes providing a third resistive element with a first terminal coupled to the NMOS bias voltage node and a second terminal coupled to the first node. In a further aspect, the method further includes providing a third amplifier including an input coupled to the output of the first differential amplifier, and an output coupled to the NMOS bias voltage node and the first terminal of the third resistive element. In yet a further aspect, the method further includes providing a fourth amplifier including an input coupled to the output of the second differential amplifier, and an output coupled to the PMOS bias voltage node and the second terminal of the second resistive element. In yet an even further aspect, the method further includes providing a first charge pump coupled between the output of the first amplifier and the NMOS bias voltage node and configured to supply voltage to the third amplifier; and providing a second charge pump coupled between the output of the second amplifier and the PMOS bias voltage node and configured to supply voltage to the fourth amplifier. In another aspect of the another embodiment, the method further includes providing slew rate limiting circuitry configured to limit a slew rate of voltage at the NMOS bias voltage node. In a further aspect, the method further includes providing a level shifter circuit having a first terminal coupled to the first node and a second terminal coupled to the second input of the first differential amplifier.

In yet another embodiment, a system for generating symmetrical back bias voltages includes a back bias voltage generator circuit including: a first resistive element connected in series with a second resistive element; a first amplifier having a first input coupled to an input voltage, a second input coupled to a first node at a first terminal of the first resistive element, and an output coupled to an N-polarity metal-oxide semiconductor (NMOS) bias voltage node; a second amplifier having a first input coupled to a symmetrical voltage, a second input coupled to a second node between a second terminal of the first resistive element and a first terminal of the second resistive element, and an output coupled to a P-polarity metal-oxide semiconductor (PMOS) bias voltage node and the second terminal of the second resistive element, wherein the symmetrical voltage is between a highest supply voltage and a lowest supply voltage coupled to the first amplifier. In one aspect, the system further includes a power management circuit; a sea of gates; the back bias voltage generator circuit coupled to receive the input voltage and the symmetrical voltage from the power management unit and to provide an NMOS bias voltage and a PMOS bias voltage to the sea of gates at the NMOS bias voltage node and PMOS bias voltage node. In yet another aspect, the system further includes a monitor circuit coupled to the sea of gates and to the power management unit, wherein the monitor circuit senses and provides information regarding power consumption and performance of the sea of gates to the power management circuit. In yet another aspect, the system further includes a third resistive element having a first terminal coupled to the NMOS bias voltage node and a second terminal coupled to the first node; a third amplifier including an input coupled to the output of the first amplifier and an output coupled to the NMOS bias voltage node and the first terminal of the third resistive element; a fourth amplifier including an input coupled to the output of the second amplifier and an output coupled to the PMOS bias voltage node, the second terminal of the second resistive element.

What is claimed is:

1. A bias regulator circuit comprising:

a voltage divider including a first resistive element and a second resistive element;

a first node of the voltage divider coupled to a first terminal of the first resistive element;

a second node of the voltage divider coupled between a second terminal of the first resistive element and a first terminal of the second resistive element;

a first amplifier with a first input coupled to an input voltage, and a second input coupled to the first node;

a first power supply coupled to the first amplifier;

a second power supply coupled to the first amplifier;

an N-polarity metal-oxide semiconductor (NMOS) bias voltage node coupled to an output of the first amplifier, a plurality of NMOS devices, and the first node;

a second amplifier with a first input coupled to a symmetry voltage, and a second input coupled to the second node;

a third power supply coupled to the second amplifier;

a fourth power supply coupled to the second amplifier;

a P-polarity metal-oxide semiconductor (PMOS) bias voltage node coupled to the output of the second amplifier, the second terminal of the second resistive element, and a plurality of PMOS devices, wherein a voltage at the NMOS bias voltage node is configured to control a voltage at the PMOS bias voltage node such that the voltage at the PMOS bias voltage node symmetrically tracks the voltage at the NMOS bias voltage node about the symmetry voltage.

2. The bias regulator circuit of claim 1, the voltage divider further including:

a third resistive element having a first terminal coupled to the NMOS bias voltage node and a second terminal coupled to the first node.

3. The bias regulator circuit of claim 2 further comprising:

a third amplifier including an input coupled to the output of the first amplifier and an output coupled to the NMOS bias voltage node and the first terminal of the third resistive element.

4. The bias regulator circuit of claim 3 further comprising:

a fourth amplifier including an input coupled to the output of the second amplifier and an output coupled to the PMOS bias voltage node, and the second terminal of the second resistive element.

5. The bias regulator circuit of claim 4 further comprising:

a first charge pump configured to supply voltage to the third amplifier; and a second charge pump configured to supply voltage to the fourth amplifier.

6. The bias regulator circuit of claim 1 further comprising:

a first charge pump coupled between the output of the first amplifier and the NMOS bias voltage node;

a second charge pump coupled between the output of the second amplifier and the PMOS bias voltage node.

7. The bias regulator circuit of claim 1 further comprising: slew rate limiting circuitry coupled to the first amplifier.

8. A bias regulator circuit comprising:

a voltage divider including a first resistive element and a second resistive element;

a first node of the voltage divider coupled to a first terminal of the first resistive element;

a second node of the voltage divider coupled between a second terminal of the first resistive element and a first terminal of the second resistive element;

a first amplifier with a first input coupled to an input voltage, and a second input coupled to the first node;

a first power supply coupled to the first amplifier;

a second power supply coupled to the first amplifier;

an N-polarity metal-oxide semiconductor (NMOS) bias voltage node coupled to an output of the first amplifier, a plurality of NMOS devices, and the first node;

a second amplifier with a first input coupled to a symmetry voltage, and a second input coupled to the second node;

a third power supply coupled to the second amplifier;

a fourth power supply coupled to the second amplifier;

a P-polarity metal-oxide semiconductor (PMOS) bias voltage node coupled to the output of the second amplifier, the second terminal of the second resistive element, and a plurality of PMOS devices; and a level shifter circuit having a first terminal coupled to the first node and a second terminal coupled to the second input of the first amplifier.

9. A method for making a semiconductor device capable of generating symmetrical back bias voltages, comprising:

providing a first resistive element and a second resistive element in series, wherein a first node is at a first terminal of the first resistive element and a second node is between a second terminal of the first resistive element and a first terminal of the second resistive element;

providing a first differential amplifier with a first input couplable to an input voltage, a second input coupled to the first node, and the output coupled to an N-polarity metal-oxide semiconductor (NMOS) bias voltage node;

providing a second differential amplifier with a first input couplable to a symmetrical voltage, a second input coupled to the second node, and the output coupled to a P-polarity metal-oxide semiconductor (PMOS) bias voltage node and the second terminal of the second resistive element, wherein the symmetrical voltage is between a highest voltage and a lowest voltage coupled to operate the first differential amplifier, and wherein a back bias voltage at the NMOS bias voltage node controls a back bias voltage at the PMOS bias voltage node such that the back bias voltage at the PMOS bias voltage node symmetrically tracks the back bias voltage at the NMOS bias voltage node about the symmetrical voltage.

10. The method of claim 9 further comprising:

coupling the NMOS bias voltage node to a plurality of NMOS semiconductor transistor devices;

coupling the PMOS bias voltage node to a plurality of PMOS semiconductor transistor devices.

11. The method of claim 9 further comprising:

providing a third resistive element with a first terminal coupled to the NMOS bias voltage node and a second terminal coupled to the first node.

12. The method of claim 11 further comprising:

providing a third amplifier including an input coupled to the output of the first differential amplifier, and an output coupled to the NMOS bias voltage node and the first terminal of the third resistive element.

13. The method of claim 12 further comprising:

providing a fourth amplifier including an input coupled to the output of the second differential amplifier, and an output coupled to the PMOS bias voltage node and the second terminal of the second resistive element.

14. The method of claim 13 further comprising:

providing a first charge pump coupled between the output of the first amplifier and the NMOS bias voltage node and configured to supply voltage to the third amplifier; and providing a second charge pump coupled between the output of the second amplifier and the PMOS bias voltage node and configured to supply voltage to the fourth amplifier.

15. The method of claim 9, further comprising:

providing slew rate limiting circuitry configured to limit a slew rate of voltage at the NMOS bias voltage node.

16. The method of claim 15 further comprising:

providing a level shifter circuit having a first terminal coupled to the first node and a second terminal coupled to the second input of the first differential amplifier.

17. A system for generating symmetrical back bias voltages, comprising:

a back bias voltage generator circuit including:

a first resistive element connected in series with a second resistive element;

a first amplifier having a first input coupled to an input voltage, a second input coupled to a first node at a first terminal of the first resistive element, and an output coupled to an N-polarity metal-oxide semiconductor (NMOS) bias voltage node;

a second amplifier having a first input coupled to a symmetrical voltage, a second input coupled to a second node between a second terminal of the first resistive element and a first terminal of the second resistive element, and an output coupled to a P-polarity metal-oxide semiconductor (PMOS) bias voltage node and the second terminal of the second resistive element, wherein the symmetrical voltage is between a highest supply voltage and a lowest supply voltage coupled to the first amplifier, wherein a voltage at the NMOS bias voltage node is configured to control a voltage at the PMOS bias voltage node such that the voltage at the PMOS bias voltage node symmetrically tracks the voltage at the NMOS bias voltage node about the symmetry voltage.

18. The system of claim 17 further comprising:

a power management circuit;

a sea of gates;

the back bias voltage generator circuit coupled to receive the input voltage and the symmetrical voltage from the power management unit and to provide an NMOS bias voltage and a PMOS bias voltage to the sea of gates at the NMOS bias voltage node and PMOS bias voltage node.

19. The system of claim 17 further comprising:

a monitor circuit coupled to the sea of gates and to the power management unit, wherein the monitor circuit senses and provides information regarding power consumption and performance of the sea of gates to the power management circuit.

20. The system of claim 17 further comprising:

a third resistive element having a first terminal coupled to the NMOS bias voltage node and a second terminal coupled to the first node;

a third amplifier including an input coupled to the output of the first amplifier and an output coupled to the NMOS bias voltage node and the first terminal of the third resistive element;

a fourth amplifier including an input coupled to the output of the second amplifier and an output coupled to the PMOS bias voltage node, the second terminal of the second resistive element.

* * * * *